United States Patent [19]

Schaible et al.

[11] 4,430,365
[45] Feb. 7, 1984

[54] METHOD FOR FORMING CONDUCTIVE LINES AND VIAS

[75] Inventors: Paul M. Schaible, Poughkeepsie, N.Y.; John Suierveld, San Jose, Calif.

[73] Assignee: International Business Machines Corporation, Armonk, N.Y.

[21] Appl. No.: 400,800

[22] Filed: Jul. 22, 1982

[51] Int. Cl.³ .......................................... H01L 27/10
[52] U.S. Cl. ...................................... 427/96; 427/88
[58] Field of Search .................................. 427/96, 88

[56] References Cited

U.S. PATENT DOCUMENTS

| | | | |
|---|---|---|---|
| 3,605,260 | 9/1971 | Spridco et al. | 427/96 |
| 3,726,002 | 4/1973 | Greenstein et al. | 29/577 |
| 3,853,715 | 12/1974 | Romankiw | 204/15 |
| 3,968,193 | 7/1976 | Langston, Jr. et al. | 264/61 |
| 4,040,891 | 8/1977 | Chang et al. | 156/651 |
| 4,045,302 | 8/1977 | Gibbs et al. | 204/15 |
| 4,132,586 | 1/1979 | Schaible et al. | 156/643 |
| 4,172,004 | 10/1979 | Alcorn et al. | 156/643 |
| 4,184,909 | 1/1980 | Chang et al. | 156/643 |
| 4,272,561 | 6/1981 | Rothman et al. | 427/84 |

OTHER PUBLICATIONS

IBM Technical Disclosure Bulletin, vol. 17, No. 6, Nov. 1974, "Monolithic Studs for Interlevel Connectors", V. Platter and G. C. Schwartz, pp. 1605-1606.
IBM Technical Disclosure Bulletin, vol. 19, No. 9, Feb. 1977, "Forming Planar Integrated Circuit Metallization", W. C. Metzger and P. M. Schaible, pp. 3364-3365.
IBM Technical Disclosure Bulletin, vol. 23, No. 4, Sep. 1980, "Reactive Ion Etch Process for Metal Wiring Using a Buried Mask", J. R. Kitcher, p. 1394.
IBM Technical Disclosure Bulletin, vol. 23, No. 4, Sep. 1980, "Integral Stud for Multilevel Metal", J. R. Kitcher, p. 1395.

*Primary Examiner*—John H. Newsome
*Attorney, Agent, or Firm*—T. Rao Coca

[57] ABSTRACT

A multilevel metallurgy is formed on a dielectric body, particularly a multilayer ceramic (MLC) body. The interconnection lines and via studs are formed as an integral structure from a blanket metal layer thus eliminating the interface between the via pad and via stud.

4 Claims, 9 Drawing Figures

METHOD FOR FORMING CONDUCTIVE LINES AND VIAS

DESCRIPTION

1. Technical Field

This invention relates to multilayer metallurgy semiconductor packages, and more particularly to multilayer ceramic packages adapted to interconnect a plurality of large scale integrated circuit chips.

2. Background Art

The advent of large scale integrated circuit (LSI) semiconductor devices has produced a great increase in circuit density. To accommodate such high density LSI devices, the interconnection density of the packaging substrate must also increase. This means that the grid size which is the minimum via spacing must shrink. Grid size minima are a function of the particular material used as an interconnection support. The high performance LSI's will require grid sizes about one-tenth that presently achievable by multilayer ceramic (MLC) technology. Dimensions on the interconnection substrate must approach those of the LSI chips.

An attempt has been made to apply the metallization technology used in the manufacture of semiconductor devices, to the fabrication of packaging substrates. However, there are large differences between a packaging substrate and its function and that of the LSI chip. Because of longer signal lines on the packaging substrate, conductivity of lines must be higher. This requires larger dimensions and, as a consequence, a thicker dielectric, and finally a new layer-to-layer via technique.

U.S. Pat. No. 3,968,193 entitled "Firing Process For Forming a Multilayer Glass-Metal Module" granted July 6, 1976 to P. R. Langston et al. and U.S. Pat. No. 3,726,002 entitled "Process For Forming a Multilayer Glass-Metal Module Adaptable For Integral Mounting To A Dissimilar Refractory Substrate" granted Apr. 10, 1973 to B. Greenstein et al., and both assigned to the same assignee as this invention, relate to a process for forming multilevel metallurgy on the surface of a MLC body. A first level metallization layer consisting of a lower chrome layer, an overlying copper layer and a top chrome layer is blanket deposited on the surface of a MLC body and the top chrome layer and the copper layer are delineated into a first level interconnection pattern which includes via pads. The lower chrome layer is left unetched. After forming a masking layer which has openings at the via pads, via studs are electroplated on the via pads using the remaining lower chrome layer as a cathode electrode. The masking layer and the exposed lower chrome layer are removed, followed by deposition of a dielectric layer and forming of a second level metallization layer.

In these prior art methods, the via studs are formed onto the via pads through mask openings. This causes reliability problems at the interface of the via pads and via studs due to residual contamination. Cleaning of the surface of the via pads in the mask openings tends to degrade the via pad metal.

"Forming Planar Integrated Circuit Metallization" by W. C. Metzger et al., published in the IBM Technical Disclosure Bulletin, Vol. 19, No. 9, February 1977, pages 3364–3365 teaches a process for forming an integral via pad and via stud structure from a single blanket metal layer. The stud area is first masked and the unmasked area is reactively ion etched to reduce the thickness of the unmasked metal layer to a desired thickness of the conductive pattern and to define via studs at the masked area. Then a second masking layer is deposited and patterned to define the desired metallurgical pattern. The metal layer is again reactively ion etched to form the integral via pad and via stud structure. This method has a drawback in that the second mask has to be formed on a non-planar metal layer which has projecting via studs.

"Integral Stud for Multilevel Metal" by J. R. Kitcher, published in the IBM Technical Disclosure Bulletin, Vol. 23, No. 4, September 1980, page 1395 discloses a method for forming a via stud. A layer of wiring metal, an etch barrier layer of chromium and a layer of stud metal are blanket deposited on a substrate. The stud metal is patterned by reactive ion etching using a resist or a magnesium oxide mask, with the chromium acting as an etch stop. The chromium and wiring metal are then patterned and etched utilizing a second mask. This method includes the same problem as the method of W. C. Metzger et al., because via pads are formed after via studs are delineated.

SUMMARY OF THE INVENTION

Accordingly, it is an object of the present invention to provide a method for forming a multilevel metallurgy on a packaging body for integrated circuit semiconductor devices.

It is another object of the present invention to provide a method for forming multilevel metallurgy on a multilayer interconnection ceramic body.

It is a further object of the present invention to provide a method for forming an integral structure of the via pad and via stud on an interconnection body for integrated circuit semiconductor chips.

In accordance with the present invention, an electrically conductive layer is blanket deposited on an interconnection body such as a multilayer ceramic body which contains multiple layers of interconnecting metallurgy. A mask is formed on the conductive layer, and defines a first level interconnection pattern and via pads for connecting the vias of the interconnection body to the first level interconnection pattern. The conductive layer is then reactively ion etched to delineate the first level interconnection pattern and the via pads. The interconnection body works as an etch stop.

A resist layer is formed on the substrate to cover the first level interconnection pattern and the via pads, followed by etching of the openings to define via stud area within the via pad area by the use of a conventional lithographic technique. A masking material resistant to reactive ion etching is deposited on the conductive layer in said openings. After removing the resist film, the substrate is subjected to reactive ion etching to reduce the thickness of the first level interconnection pattern and to form the integral via pad and via stud structure.

The mask layer on the via studs is removed and a dielectric layer is deposited and planarized exposing the top surface of the via studs. A second level interconnection metallurgy is formed on the dielectric layer by the same process or by the use of a conventional method.

BEST MODE FOR CARRYING OUT THE INVENTION

Figure 1:
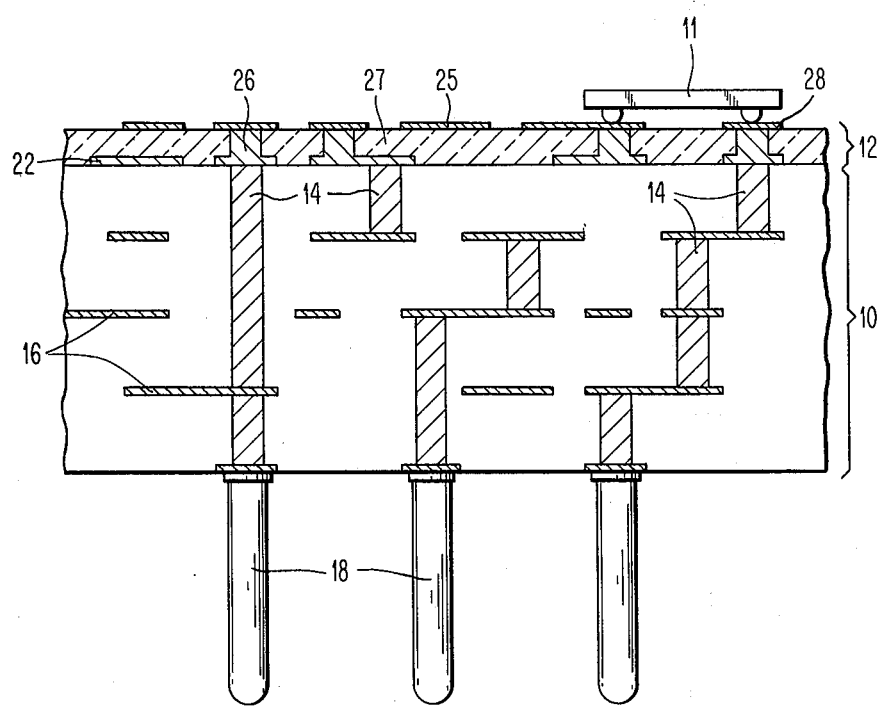
FIG. 1 is a schematic diagram of the cross-section of a multilevel interconnection package manufactured in accordance with the present invention.

FIG. 1 illustrates a cross-section of a multilevel interconnection packaging structure for mounting large scale integrated circuit semiconductor device chips. The package comprises a multilayer ceramic body 10, a multilevel interconnection layer 12 formed on one surface of the MLC body 10, to the bottom of which are connected a plurality of input/output pins 18. The MLC body includes multiple layers of conductive patterns 16, the different levels of which are connected by vias 14 as required by the circuit design.

The multilevel interconnection layer 12 is formed to provide a smaller grid size of a denser interconnection on the surface portion of the packaging substrate. It includes a first level of conductive pattern 22, a dielectric layer 27, a second level of conductive pattern 25, and via studs 26 which connect the first and second level conductive patterns. The second level metallurgy includes pads 28 for mounting integrated circuit chips 11 and pads for engineering change or wire bonding. Or, a second dielectric layer may be coated on the second level metallurgy and a third level metallurgy may be formed thereon.

FIGS. 2 through 9 are schematic step-by-step cross-sectional views illustrating a preferred embodiment for forming a multilevel metallurgy on a ceramic body. A ceramic body 10 having conductive vias 14 is lapped for flatness within approximately 3 microns with a boron carbide slurry. This step is followed by ultrasonic cleaning and rinsing steps using a cleaning agent such as isopropanol.

Figure 2:
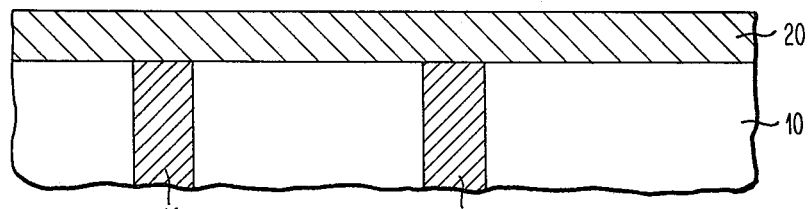
FIGS. 2 through 9 are schematic step-by-step cross-sectional vias illustrating a preferred embodiment of the invention.

With reference to FIG. 2, a blanket metallization layer 20 is deposited on the surface of the ceramic body 10. In the preferred embodiment, the metallization layer 20 comprises a lower chromium layer of approximately 800 Å thickness, an overlying copper layer of approximately 18 microns thickness, and a top chromium layer of approximately 800 Å thickness. The chrome metal is selected as the bottom and top layers because of its superior adhesion to both ceramic and glass surfaces. The thick copper layer provides the primary electrical conductive path.

Figure 3:
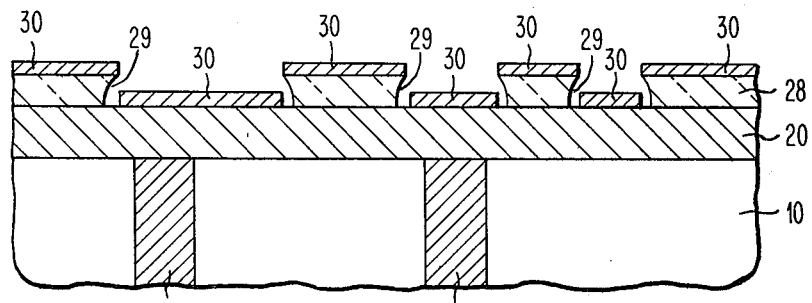

Now referring to FIG. 3, a resist material 28 (to be used as a lift-off mask) is applied over the metal layer 20 and is exposed and developed to form openings 29 in the pattern of the first level interconnection by the use of a conventional lithographic technology. A 1 micron layer of masking material for reactive ion etching such as magnesium oxide 30 is evaporated on top of the lift-off mask 28 and on the exposed portions of the metal layer 20. Next, utilizing conventional lift-off technique, the remaining portions of the resist mask 28 are completely removed by suitable solvents or etchants which also carry away the overlying magnesium oxide coating to leave behind the magnesium oxide segments 30 forming a reactive ion etching mask.

The lift-off process for making the MgO mask is described in more detail in P. M. Schaible et al. U.S. Pat. No. 4,132,586 entitled "Selective Dry Etching of Substrates".

Alternately, a pattern can be formed in the MgO film by subtractive etching. A resist film is coated on the blanket MgO film and an appropriate pattern is defined therein by optical or E-beam lithography. The unmasked MgO regions are etched in a saturated solution of ammonium oxalate at room temperature.

Figure 4:
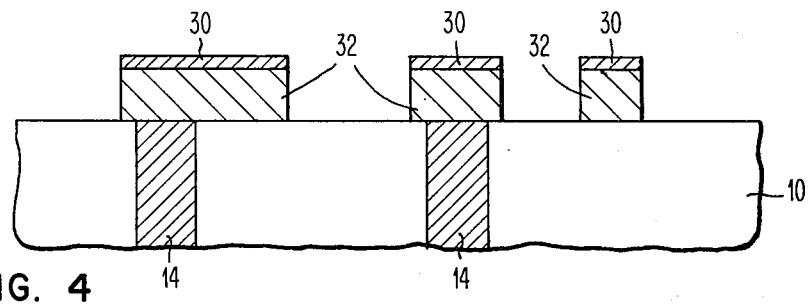
Figure 5:
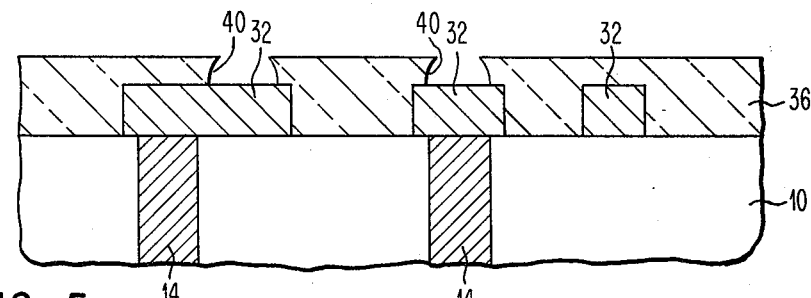

Next, the unmasked region of the metal layer 20 is reactively ion etched to form metal segments 32 under magnesium oxide segments 30, the structure as illustrated in FIG. 4. Typically, the metal layer 20 is ion etched at 1.3 W/cm$^2$ at 13.56 MHz in a 5 mTorr CCl$_4$/5 mTorr Ar environment having a 2.5 sccm flow rate of CCl$_4$ with a cathode temperature of 225° C. Using these conditions, the composite metal layer consisting of 800 Å lower chromium layer, 18 micron overlying copper layer and 800 Å top chromium layer can be etched in about 30 to 40 minutes. Since the dielectric body 10 works as an etch stop, etching time does not require critical attention.

The MgO mask 30 is removed in a suitable solvent or etchant, as for example by immersion for two minutes in a warm (40°–50° C.) solution of oxalic acid.

A thick photoresist film 36 is laminated on the substrate to cover the first level metal pattern 32 by spin coating or by the use of a dry photoresist film, or by the combination of the two methods. The resist film is exposed and developed by the conventional lithographic technique to form openings 40 of the typical diameter of 50 microns on top of the first level metal 32 where via studs are to be formed.

Figure 6:
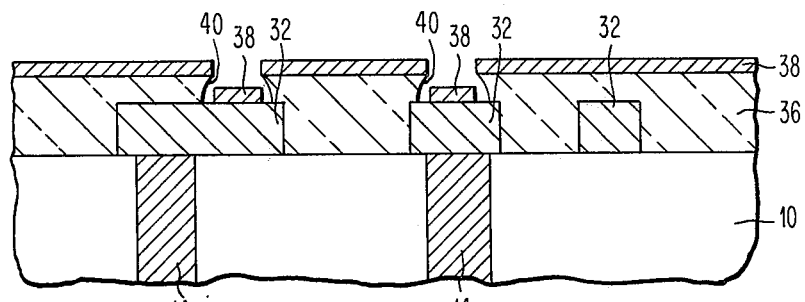
Figure 7:
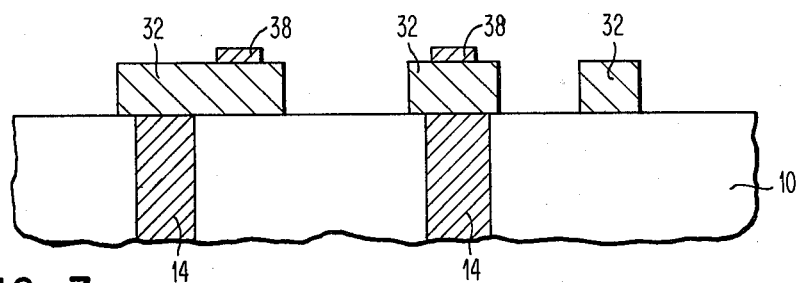

A masking material 38 for reactive ion etching, typically magnesium oxide, is evaporated on the resist film 36 and on the exposed surface of the first level metal 32 to the thickness of about 1 micron as illustrated in FIG. 6.

Figure 8:
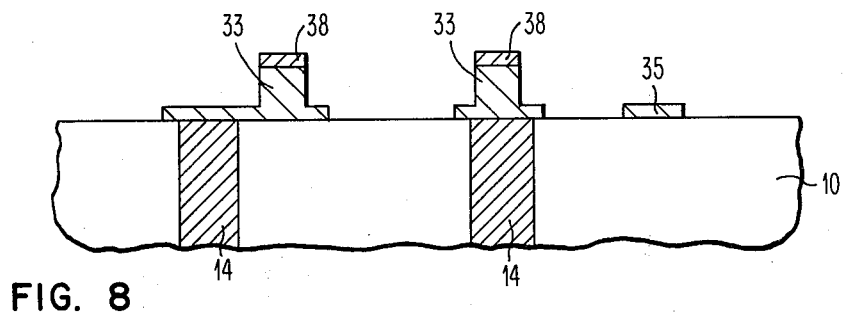

The resist film 36 is completely removed by suitable solvents which carry away the overlying magnesium oxide coating. Utilizing the remaining magnesium oxide segments 38 as a mask, the first level metal is reactive ion etched to reduce the thickness of the first level interconnection metal to approximately 3 microns and to form via studs 33 of approximately 15 microns tall as illustrated in FIG. 8. The etching conditions can be similar to those used for etching the blanket metal layer 20 when the structure of FIG. 4 was formed. As long as the appropriate electrical conductivity is achieved, the thickness of the first level interconnection 35 is not critical.

Figure 9:
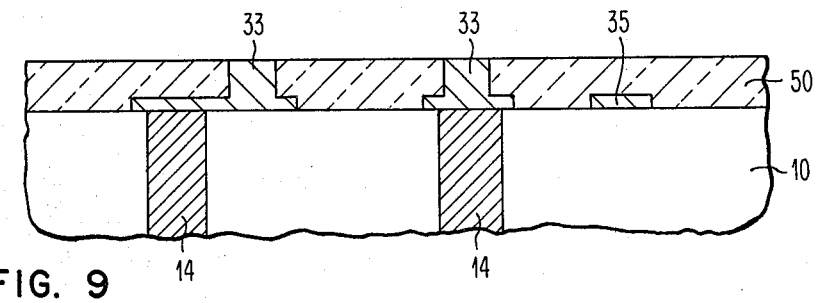

After the MgO mask 38 is removed by immersion in a warm solution of oxalic acid, a film of a dielectric material 50 such as glass or polyimide is coated on the substrate as shown in FIG. 9. The dielectric material may be coated by doctor blading, sedimentation, evaporation, spraying or spinning. A typical method for coating a glass film is described in U.S. Pat. No. 3,968,193 granted to P. R. Langston. Polyimide can also be spin-coated on the substrate by a conventional technique.

The dielectric layer 50 is lapped to provide a planar surface necessary for subsequent photolithographic steps and to expose the top surface of the via studs 33. Alternately, RIE or plasma etching can be used to etch polyimide to expose the top surface of the via studs.

A second level interconnection is formed on the surface of the dielectric layer 50 using the same process as that used for forming the first level interconnection. Any of the conventional metallization techniques may also be used for forming the second level interconnection.

While this invention has been particularly described with reference to the preferred embodiments thereof, it will be understood by those skilled in the art that the foregoing and other changes in form and details may be made therein without departing from the spirit and scope of the invention.

We claim:

1. A method of fabricating on a multilayer interconnection ceramic body a metallurgical interconnection package for interconnection of a plurality of large scale integrated circuit semiconductor chips said ceramic body including an interconnection pattern and vias therein, the vias extending from said interconnection pattern and forming a planar surface with said ceramic body, said method comprising the steps of:

depositing a blanket layer of conductive material on said planar surface;

delineating said layer of conductive material into a circuit pattern connected to said vias;

forming a mask which is resistive to reactive ion etching on the surface of said circuit pattern to define the area where the via studs are to be formed;

subjecting to reactive ion etching unmasked areas of said circuit pattern to reduce the thickness of the circuit pattern and to form via studs;

forming a dielectric material on said ceramic body;

whereby said circuit pattern and via studs are formed as an integral structure from said blanket layer.

2. The method of claim 1 wherein a second level interconnection is formed on said dielectric material.

3. The method of claim 2 wherein the minimum via stud spacing of said circuit pattern is smaller than that of said vias in said ceramic body by a factor of as much as 10.

4. A method of fabricating on a multilayer ceramic substrate a metallurgical interconnection package for large scale integrated circuit semiconductor devices said substrate including multiple layers of conductive patterns and vias, the vias extending from said conductive patterns and forming a planar surface with said substrate, said method comprising the steps of:

depositing a blanket layer of a conductive material on said planar surface of the substrate;

forming a photoresist mask with openings to expose a desired metallurgical pattern connected to said vias;

depositing a blanket layer of magnesium oxide over the photoresist mask and into its openings;

removing the photoresist mask to lift-off overlying magnesium oxide to retain a magnesium oxide mask covering said desired metallurgical pattern;

reactively ion etching the metallurgical pattern exposed by the magnesium oxide mask to form a precursor of said metallurgical pattern;

removing said magnesium oxide mask;

forming a new photoresist mask with openings defining desired via studs on said etched precursor metallurgical pattern;

depositing a blanket magnesium oxide layer over the new photoresist mask and into the openings thereof;

removing the new photoresist mask and overlying magnesium oxide to retain a new magnesium oxide mask at the desired via studs;

reactively ion etching to form the via studs and the metallurgical interconnection pattern by removal of exposed precursor pattern not covered by the new magnesium oxide mask to the required thickness;

forming a dielectric material over the metallurgical interconnection pattern to the height of the via studs;

whereby is formed an integral structure of metallurgical via studs and interconnection pattern connected to said vias in the multilayer ceramic substrate.

* * * * *